US011624799B2

(12) United States Patent
Cesaretti et al.

(10) Patent No.: US 11,624,799 B2
(45) Date of Patent: Apr. 11, 2023

(54) METHOD AND APPARATUS FOR DETECTING ERRORS IN A MAGNETIC FIELD SENSOR

(71) Applicant: Allegro MicroSystems, LLC, Manchester, NH (US)

(72) Inventors: Juan Manuel Cesaretti, Ciudad de Buenos Aires (AR); Leandro Tozzi, Buenos Aires (AR); Paola Anabella Ceminari, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 84 days.

(21) Appl. No.: 17/380,244

(22) Filed: Jul. 20, 2021

(65) Prior Publication Data
US 2023/0025177 A1  Jan. 26, 2023

(51) Int. Cl.
G01R 33/09 (2006.01)
G01R 35/00 (2006.01)
G01R 33/07 (2006.01)

(52) U.S. Cl.
CPC .............. *G01R 35/00* (2013.01); *G01R 33/07* (2013.01); *G01R 33/09* (2013.01)

(58) Field of Classification Search
CPC ......... G01R 35/00; G01R 33/09; G01R 33/07
See application file for complete search history.

(56) References Cited

U.S. PATENT DOCUMENTS

| 8,008,908 | B2 | 8/2011 | Doogue et al. |
| 8,222,888 | B2 | 7/2012 | David et al. |
| 10,635,539 | B2 | 4/2020 | Cook et al. |
| 10,852,161 | B2 | 12/2020 | Cesaretti et al. |
| 2015/0061559 | A1* | 3/2015 | Nakamura ............... H02P 6/12 318/400.38 |
| 2015/0142376 | A1 | 5/2015 | Ausserlechner |
| 2017/0248445 | A1 | 8/2017 | Ausserlechner |
| 2019/0120659 | A1* | 4/2019 | Bussan ................... G01D 5/16 |

(Continued)

FOREIGN PATENT DOCUMENTS

| DE | 10320057 | 12/2004 |
| EP | 3550269 | 10/2019 |

OTHER PUBLICATIONS

U.S. Appl. No. 17/363,732, filed Jun. 30, 2021, Cesaretti, et al.

(Continued)

*Primary Examiner* — Alesa Allgood
(74) *Attorney, Agent, or Firm* — Daly, Crowley, Mofford & Durkee, LLP

(57) ABSTRACT

A method for use in a sensor includes generating a first signal by a first sensing module in response to a magnetic field associated with a rotating target, generating a base word based on the first signal, the base word including a first base bit that is generated by comparing respective components of the first signal, reversing a respective polarity of the first signal and offsetting the first signal, generating a test word based on the first signal, the test word being generated after the respective polarity of the first signal is reversed and the first signal is offset, the test word including a first test bit that is generated by comparing the respective components of the first signal, and setting a value of an error signal based on whether the test word matches the base word.

25 Claims, 9 Drawing Sheets

(56) References Cited

U.S. PATENT DOCUMENTS

2021/0072016 A1    3/2021   Kollmitzer et al.
2021/0156664 A1    5/2021   Binder et al.
2023/0003503 A1    1/2023   Cesaretti et al.

OTHER PUBLICATIONS

U.S. Appl. No. 17/344,295, filed Jun. 10, 2021, Vuillermet, et al.
Extended European Search Report dated Oct. 12, 2022 for European Application No. EP22168908.6; 7 pages.
Office Action dated Dec. 29, 2022 for U.S. Appl. No. 17/363,732; 9 pages.

\* cited by examiner

BASE WORD
[<SIGNAL_409A @ STATE_902>, <SIGNAL_409B @ STATE_902>, <SIGNAL_409C @ STATE_902>]

TEST WORD
[<SIGNAL_409A @ STATE_904>, <SIGNAL_409B @ STATE_904>, <SIGNAL_409C @ STATE_904>]

FIG. 10

| BASE WORD | ACCEPTABLE TEST WORDS |
|---|---|
| 000 | 111 |
| 001 | 110 |
| 011 | 100 |
| 100 | 011 |
| 110 | 001 |
| 111 | 000 |

METHOD AND APPARATUS FOR DETECTING ERRORS IN A MAGNETIC FIELD SENSOR

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a method for use in a sensor is provided, comprising: generating a first signal, the first signal being generated by a first sensing module in response to a magnetic field associated with a rotating target; generating a base word based on the first signal, the base word including a first base bit that is generated by comparing respective components of the first signal; reversing a respective polarity of the first signal and offsetting the first signal; generating a test word based on the first signal, the test word being generated after the respective polarity of the first signal is reversed and the first signal is offset, the test word including a first test bit that is generated by comparing the respective components of the first signal; and setting a value of an error signal based on whether the test word matches the base word.

According to aspects of the disclosure, a sensor is provided, comprising: a first sensing module that is configured to generate a first signal in response to a magnetic field associated with a rotating target, the first sensing module being configured to alternate a first polarity of the first signal between a normal polarity and a reversed polarity; an offsetting circuitry configured to offset the first signal when the first polarity of the first signal is reversed; and processing circuitry configured to: generate a base word based on the first signal, the base word including a first base bit that is generated by comparing respective components of the first signal, the base word being generated when the first signal has a normal polarity; generate a test word based on the first signal, the test word being generated after the first polarity of the first signal is reversed and the first signal is offset, the test word including a first test bit that is generated by comparing the respective components of the first signal; and set a value of an error signal based on whether the test word matches the base word.

According to aspects of the disclosure, a sensor is provided, comprising: means for generating a first signal in response to a magnetic field associated with a rotating target; means for generating a base word based on the first signal, the base word including a first base bit that is generated by comparing respective components of the first signal; means for reversing a respective polarity of the first signal and offsetting the first signal; means for generating a test word based on the first signal, the test word being generated after the respective polarity of the first signal is reversed and the first signal is offset, the test word including a first test bit that is generated by comparing the respective components of the first signal; and means for setting a value of an error signal based on whether the test word matches the base word.

BRIEF DESCRIPTION OF THE DRAWINGS

The foregoing features may be more fully understood from the following description of the drawings in which:

FIG. 10 is a diagram of an example of a base word and a test word, according to aspects of the disclosure;

DETAILED DESCRIPTION

Figure 1B:
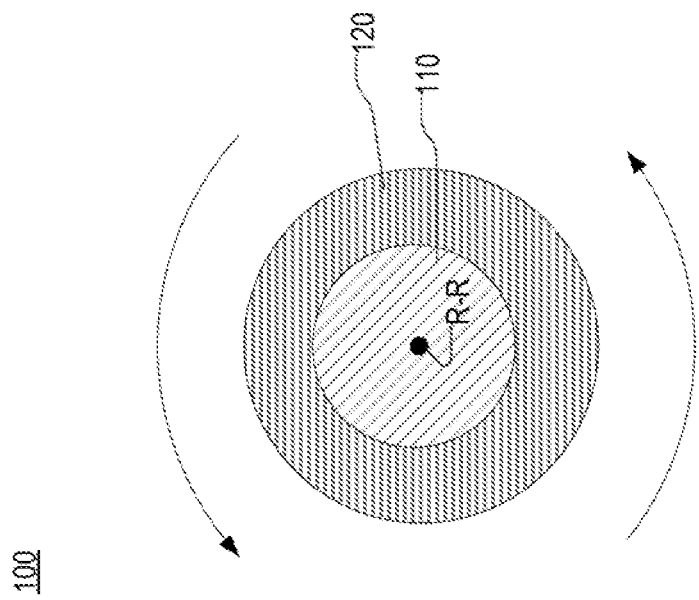
FIG. 1B is a diagram of an example of a system, according to aspects of the disclosure.
Figure 1A:
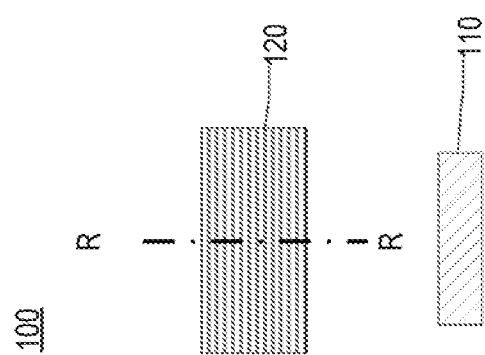
FIG. 1A is a diagram of an example of a system, according to aspects of the disclosure.

FIGS. 1A-B illustrate an example of a system 100, according to aspects of the disclosure. The system 100 may include a target 120 and a sensor 110. The target 120 may be configured to rotate about an axis R-R. The sensor 110 may be disposed adjacent to the target 120 and detect one or more of speed of rotation, angular position, direction, and/or any other characteristic of the movement of the target 120. According to the example of FIGS. 1A-B, the target 120 is a permanent magnet. However, alternative implementations are possible in which the rotating target 120 includes an electromagnet, a gear, a ferromagnetic object which is used with a back biased magnet, a shaft, a wheel, and/or any other suitable type of element.

Figure 2:
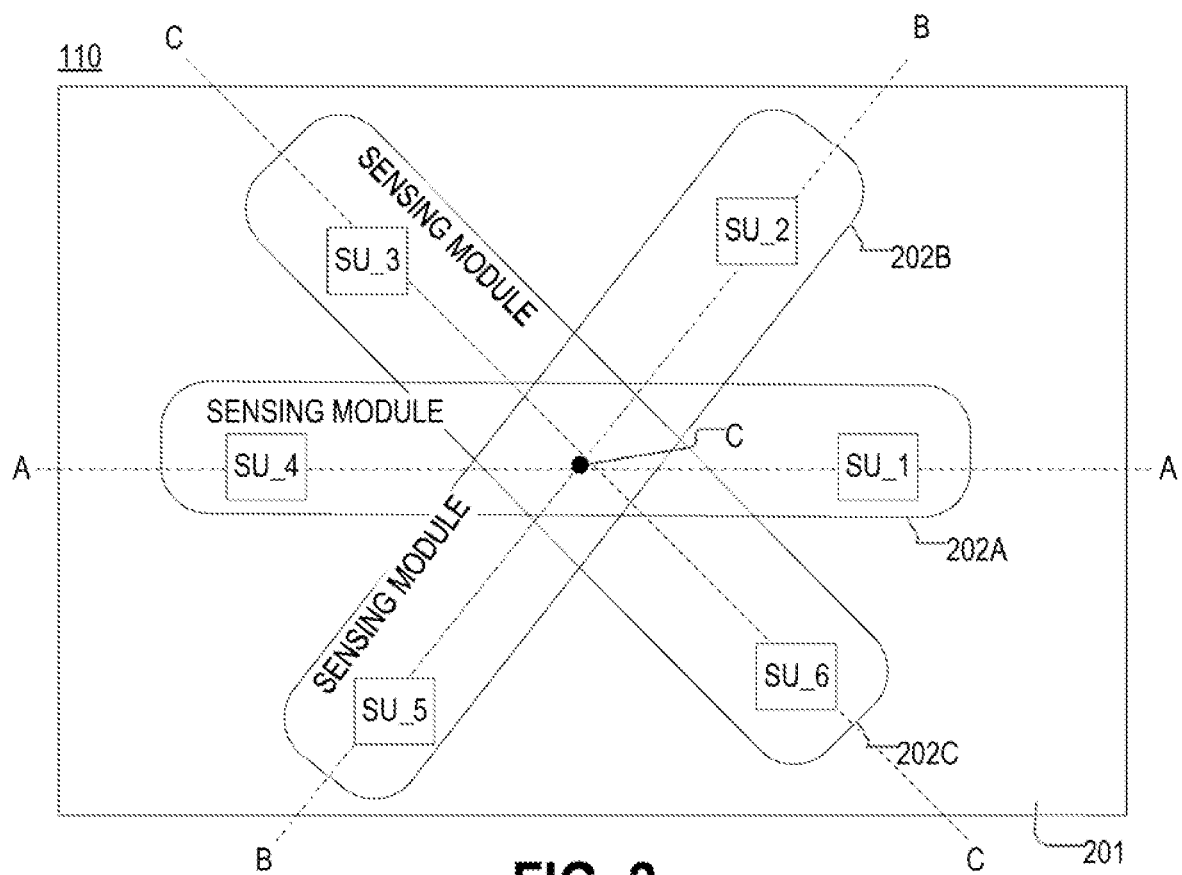
FIG. 2 is a diagram of an example of a sensor, according to aspects of the disclosure.

FIG. 2 is a diagram of the sensor 110, according to aspects of the disclosure. As illustrated, the sensor may include sensing modules 202A-C that are formed on a substrate 201. The sensing module 202A may include sensing units SU_1 and SU_4. The sensing units SU_1 and SU_4 may be spaced apart from one another along the length of an axis A-A. The sensing module 202A may include sensing units SU_2 and SU_5. The sensing units SU_2 and SU_5 may be spaced apart from one another along the length of an axis B-B. The sensing module 202C may include sensing units SU_3 and SU_6. The sensing units SU_3 and SU_6 may be spaced apart from one another along the length of an axis C-C.

According to the example of FIG. 2, axes A-A and B-B intersect at a 60-degree angle, and axes B-B and C-C also intersect at a 60-degree angle. However, the disclosure is not limited to axes A-A, B-B, and C-C intersecting at any specific angle. According to the example of FIG. 2, axes A-A, B-B, and C-C, intersect at point C, but the present disclosure is not limited to all of axes A-A, B-B, and C-C intersecting at the same point. According to the present example, point C lies on the rotational axis R-R, which is discussed above with respect to FIGS. 1A-B, however it will be understood that the present disclosure is not limited to any specific positioning of the sensor 110 relative to a rotating target.

Sensing unit SU_1 may include one or more first magnetic field sensing elements and sensing unit SU_4 may also include one or more first magnetic field sensing elements. The first magnetic field sensing elements that constitute sensing unit SU_1 may be formed at the location denoted by the rectangle labeled "SU_1". The first magnetic field sensing elements that constitute sensing unit SU_4 may be formed at the location denoted by the rectangle labeled "SU_4." According to the present example, each of the first sensing elements is a Hall effect element. However, alternative implementations are possible in which any of the first sensing elements includes one or more of a giant magnetoresistor (GMR), a tunnel magnetoresistor (TMR), a receive coil, and/or any other suitable type of magnetic field sensing element.

Sensing unit SU_2 may include one or more second magnetic field sensing elements and sensing unit SU_5 may also include one or more second magnetic field sensing elements. The second magnetic field sensing elements that constitute sensing unit SU_2 may be formed at the location denoted by the rectangle labeled "SU_2". The second magnetic field sensing elements that constitute sensing unit SU_5 may be formed at the location denoted by the rectangle labeled "SU_5." According to the present example, each of the second sensing elements is a Hall effect element. However, alternative implementations are possible in which any of the second sensing elements includes one or more of at a giant magnetoresistor (GMR), a tunnel magnetoresistor (TMR), a receive coil, and/or any other suitable type of magnetic field sensing element.

Sensing unit SU_3 may include one or more third magnetic field sensing elements and sensing unit SU_6 may also include one or more third magnetic field sensing elements. The third magnetic field sensing elements that constitute sensing unit SU_3 may be formed at the location denoted by the rectangle labeled "SU_3". The third magnetic field sensing elements that constitute sensing unit SU_6 may be formed at the location denoted by the rectangle labeled "SU_6." According to the present example, each of the third sensing elements is a Hall effect element. However, alternative implementations are possible in which any of the third sensing elements includes one or more of a giant magnetoresistor (GMR), a tunnel magnetoresistor (TMR), a receive coil, and/or any other suitable type of magnetic field sensing element.

Figure 4:
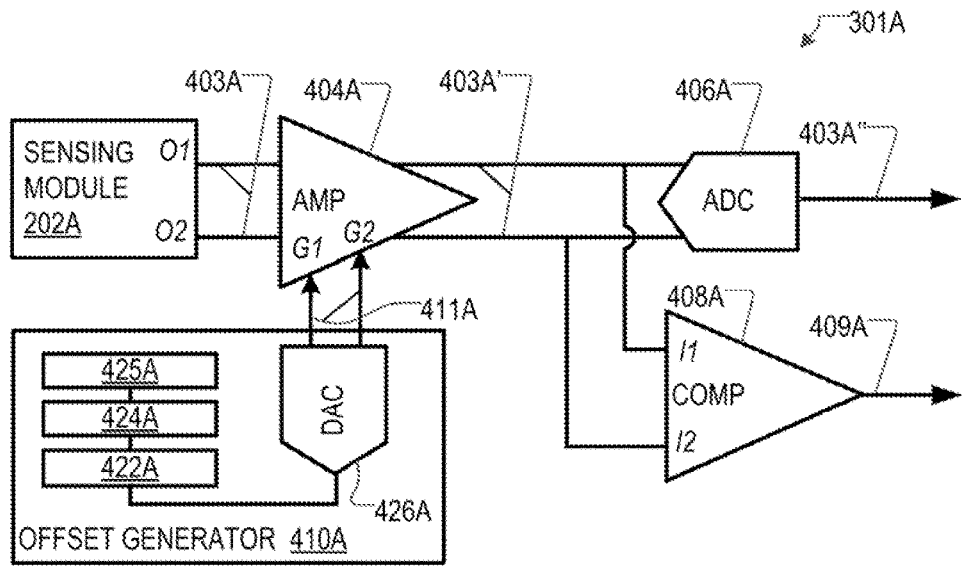
FIG. 4 is a diagram of a first stage of the sensor of claim 3, according to aspects of the disclosure.
Figure 4:
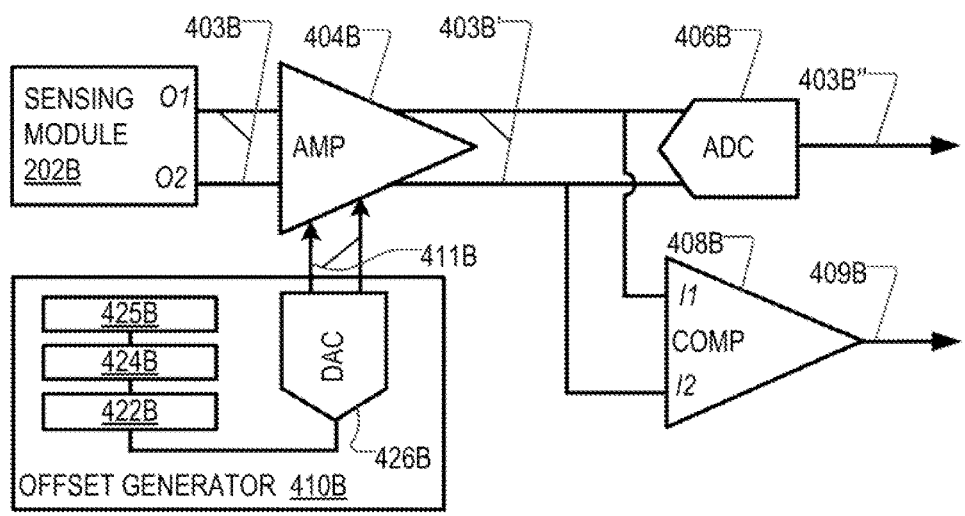
Figure 4:
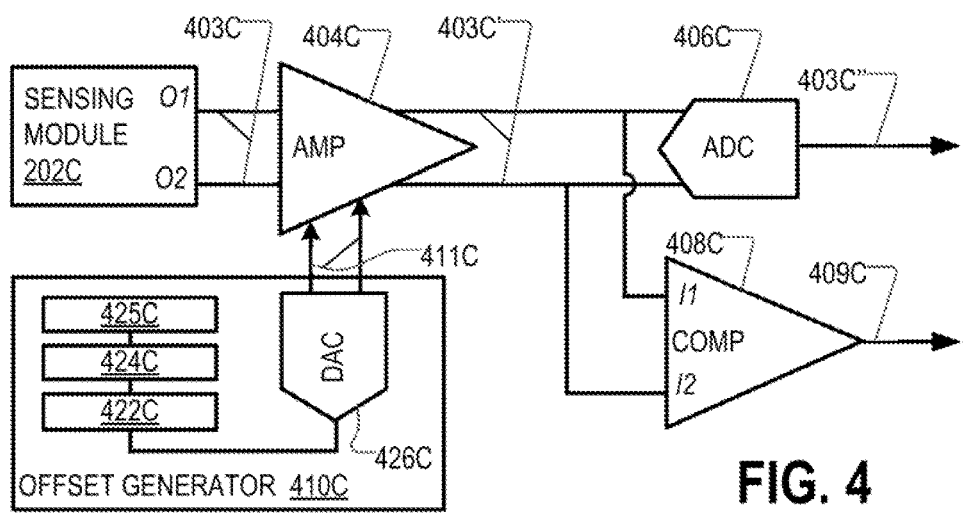

Sensing module 202A may be configured to generate a differential signal 403A (shown in FIG. 4). Signal 403A may have a first component and a second component. The first component of the signal 403A may be generated by sensing unit SU_1. The second component of the signal 403A may be generated by sensing unit SU_4. Differential signal 403A may have either a normal polarity or a reversed polarity. When the differential signal 403A has a normal polarity, the first component of the signal 403A may be output on output terminal O1 of the sensing module 202A and the second component of the signal 403A may be output on the output terminal O2 (shown in FIG. 4.) When the signal 403A has reversed polarity, the first component of the signal 403A may be output on the output terminal O2 of the sensing module 202A and the second component of the signal 403A may be output on the output terminal O1 of the sensing module 202A.

Sensing module 202B may be configured to generate a differential signal 403B (shown in FIG. 4). Signal 403B may have a first component and a second component. The first component of the signal 403B may be generated by sensing unit SU_2. The second component of the signal 403B may be generated by sensing unit SU_5. Signal 403B may have either a normal polarity or a reversed polarity. When the differential signal 403B has a normal polarity, the first component of the signal 403B may be output on output terminal O1 of the sensing module 202B and the second component of the signal 403B may be output on the output terminal O2 (shown in FIG. 4.) When the signal 403B has reversed polarity, the first component of the signal 403B may be output on the output terminal O2 of the sensing module 202B and the second component of the signal 403B may be output on the output terminal O1 of the sensing module 202B.

Sensing module 202C may be configured to generate a differential signal 403C (shown in FIG. 4). Signal 403C may have a first component and a second component. The first component of the signal 403C may be generated by sensing unit SU_3. The second component of the signal 403C may be generated by sensing unit SU_6. Differential signal 403C may have either a normal polarity or a reversed polarity. When the differential signal 403C has a normal polarity, the first component of the signal 403C may be output on output terminal O1 of the sensing module 202C and the second component of the signal 403C may be output on the output terminal O2 (shown in FIG. 4.) When the signal 403C has reversed polarity, the first component of the signal 403C may be output on the output terminal O2 of the sensing module 202C and the second component of the signal 403C may be output on the output terminal O1 of the sensing module 202C.

Figure 3:
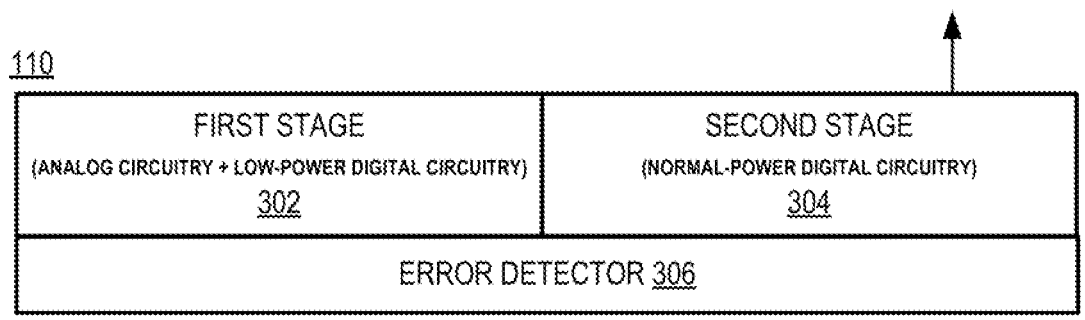
FIG. 3 is a diagram of an example of a sensor, according to aspects of the disclosure.

FIG. 3 is a diagram of the sensor 110 in accordance with another aspect of the disclosure. As illustrated the sensor 110 may include a first stage 302, a second stage 304, and an error detector 306. The first stage 302 is discussed in further detail with respect to FIG. 4. The second stage 304 is discussed in further detail with respect to FIG. 5. And the error detector 306 is discussed in further detail with respect to FIG. 6.

FIG. 4 shows an example of one possible implementation of the first stage 302. As illustrated, the first stage 302 may include a signal path 301A, a signal path 301B, and a signal path 301C. Although in the example of FIG. 4, the first stage 302 includes three channels (or signal paths), it will be understood that the present disclosure is not limited to any specific number of channels being present in the sensor 110. For example, in some implementations, the first stage 302 may include only one signal path (or channel) or two signal paths (or channels).

Signal path 301A may include the sensing module 202A, an amplifier 404A, an analog-to-digital converter (ADC) 406A, a comparator 408A, and an offset generator 410A. The sensing module 202A may generate the signal 403A and provide the signal 403A to amplifier 404A. The amplifier 404A may amplify the signal 403A to produce a signal 403A'. The amplifier 404A may include gain control terminals G1 and G2 for controlling the gain of the amplifier 404A. The ADC 406A may digitize the signal 403A' to produce a digital signal 403A", which is subsequently provided to the second stage 304 of the sensor 110. According to the present example, the signal 403A' is an amplified version of the signal 403' and the signal 403" is a digitized version of the signal 403A'. For this reason, the numerals 403' and 403" may be used interchangeably with 403 to refer to the signal that is output by the sensing module 202A.

The offset generator 410A may include an offset processor 422A, an offset register 424A, an offset register 425A, and a digital-to-analog converter (DAC) 426A. The offset register 424A may be configured to store an offset value (e.g., an integer or a floating-point number, etc.). The offset register 425A may be configured to store a base offset value. According to the present example, the base offset value is equal to zero. The offset processor 422A may retrieve the offset values from the offset registers 424A and 425A and apply them at the inputs of DAC 426A. The DAC 426A may convert the offset values to analog form. Specifically, the DAC 426A may generate an offset signal 411A based on the offset values. The DAC 426A may apply the offset signal 411A at the gain control terminals G1 and G2 of the amplifier 404A. In some implementations, the gain control signal 411A may be set to equal the value of the base offset (stored in the register 425A) when the polarity of the signal 403A is normal, while it may be set to equal the value of the sum of the base offset (stored in register 425A) and the offset (stored in register 424A) when the polarity of the signal 403B (or any of signals 403B' and 403B") is reversed. As a result of this arrangement, the signal 403A may be offset by the offset value (stored in register 424A) only when the polarity of the signal 403A is reversed, such that when the signal 403A has a normal polarity the level of the signal 403A may be unaffected by the offset generator 410A.

The comparator 408A may receive the signal 403A' at input terminals I1 and I2. As noted above, the signal 403A' may be an amplified (or otherwise processed) version of the signal 403A. In this regard, the comparator 408A may receive one of the components of the signal 403A (or an amplified/processed version thereof) at input terminal I1 and the other one of the components of the signal 403A (or an amplified/processed version thereof) at input terminal I2.

In operation, the comparator 408A may evaluate the function max (I1, I2) and output a signal 409A as a result of executing the function. When the input at terminal I1 is greater than the input at terminal I2, the comparator 408A may set signal 409A to '1' (i.e., 'logic-high'). When the input at terminal I1 is smaller than the input at terminal I2, the comparator 408A may set the signal 409A to '0' (i.e., logic-low). So, when the signal 403A has a normal polarity, if the first component of signal 403A is greater than the second component of signal 403A, the signal 409A may be set to '1', and otherwise, if the first component is smaller than the second component, the signal 409A may be set to '0'. On the other hand, when the signal 403A has a reversed polarity, if the first component of signal 403A is greater than the second component of signal 403A, the signal 409A may be set to '0', and otherwise, if the first component is smaller than the second component, the signal 409A may be set to '1'.

Signal path 301B may include the sensing module 202B, an amplifier 404B, an analog-to-digital converter (ADC) 406B, a comparator 408B, and an offset generator 410B. The sensing module 202B may generate the signal 403B and provide the signal 403B to amplifier 404B. The amplifier 404B may amplify the signal 403B to produce a signal 403B'. The amplifier 404B may include gain control terminals G1 and G2 for controlling the gain of the amplifier 404B. The ADC 406B may digitize the signal 403B' to produce a digital signal 403B", which is subsequently provided to the second stage 304 of the sensor 110. According to the present example, the signal 403B' is an amplified version of the signal 403' and the signal 403" is a digitized version of the signal 403B'. For this reason, the numerals 403' and 403" may be used interchangeably with 403 to refer to the signal that is output by the sensing module 202B.

The offset generator 410B may include an offset processor 422B, an offset register 424B, an offset register 425B, and a digital-to-analog converter (DAC) 426B. The offset register 424B may be configured to store an offset value (e.g., an integer or a floating-point number, etc.). The offset register 425B may be configured to store a base offset value. According to the present example, the base offset value is equal to zero. The offset processor 422B may retrieve the offset values from the offset registers 424B and 425B and apply them at the inputs of DAC 426B. The DAC 426B may convert the offset values to analog form. Specifically, the DAC 426B may generate an offset signal 411B based on the offset values. The DAC 426B may apply the offset signal 411B at the gain control terminals G1 and G2 of the amplifier 404B. In some implementations, the gain control signal 411B may be set to equal the value of the base offset (stored in the register 425B) when the polarity of the signal 403B is normal, while it may be set to equal the value of the sum of the base offset (stored in register 425B) and the offset (stored in register 424B) when the polarity of the signal 403B (or any of signals 403B' and 403B") is reversed. As a result of this arrangement, the signal 403B may be offset by the offset value (stored in register 424B) only when the polarity of the signal 403B is reversed, so that when the signal 403B has a normal polarity the level of the signal 403B may be unaffected by the offset generator 410B.

The comparator 408B may receive the signal 403B' at input terminals I1 and I2. As noted above, the signal 403B' may be an amplified (or otherwise processed) version of the signal 403B. In this regard, the comparator 408B may receive one of the components of the signal 403B (or an amplified/processed version thereof) at input terminal I1 and the other one of the components of the signal 403B (or an amplified/processed version thereof) at input terminal I2.

In operation, the comparator 408B may evaluate the function max (I1, I2) and output a signal 409B as a result of executing the function. When the input at terminal I1 is greater than the input at terminal I2, the comparator 408B may set signal 409B to '1' (i.e., 'logic-high'). When the input at terminal I1 is smaller than the input at terminal I2, the comparator 408B may set the signal 409B to '0' (i.e., logic-low). So, when the signal 403B has a normal polarity, if the first component of signal 403B is greater than the second component of signal 403B, the signal 409B may be set to '1', and otherwise, if the first component is smaller than the second component, the signal 409B may be set to '0'. On the other hand, when the signal 403B has a reversed polarity, if the first component of signal 403B is greater than the second component of signal 403B, the signal 409B may be set to '0', and otherwise, if the first component is smaller than the second component, the signal 409B may be set to '1'.

Signal path 301C may include the sensing module 202C, an amplifier 404C, an analog-to-digital converter (ADC) 406C, a comparator 408C, and an offset generator 410C. The sensing module 202C may generate the signal 403C and provide the signal 403C to amplifier 404C. The amplifier 404C may amplify the signal 403C to produce a signal 403C'. The amplifier 404C may include gain control terminals G1 and G2 for controlling the gain of the amplifier 404C. The ADC 406C may digitize the signal 403C' to produce a digital signal 403C", which is subsequently provided to the second stage 304 of the sensor 110. According to the present example, the signal 403C' is an amplified version of the signal 403' and the signal 403" is a digitized version of the signal 403C'. For this reason, the numerals 403' and 403" may be used interchangeably with 403 to refer to the signal that is output by the sensing module 202C.

The offset generator 410C may include an offset processor 422C, an offset register 424C, an offset register 425C, and a digital-to-analog converter (DAC) 426C. The offset register 424C may be configured to store an offset value (e.g., an integer or a floating-point number, etc.). The offset register 425C may be configured to store a base offset value. According to the present example, the base offset value is equal to zero. The offset processor 422C may retrieve the offset values from the offset registers 424C and 425C and apply them at the inputs of DAC 426C. The DAC 426C may convert the offset values to analog form. Specifically, the DAC may generate an analog offset signal 411C based on the offset values. The DAC 426C may apply the offset signal 411C at the gain control terminals G1 and G2 of the amplifier 404C. In some implementations, the gain control signal 411C may be set to equal the value of the base offset (stored in the register 425C) when the polarity of the signal 403C is normal, while it may be set to equal the value of the sum of the base offset (stored in register 425C) and the offset (stored in register 424C) when the polarity of the signal 403C (or any of signals 403C' and 403C") is reversed. As a result of this arrangement, the signal 403C may be offset by the offset value (stored in register 424C) only when the polarity of the signal 403C is reversed, so that when the signal 403C has a normal polarity the level of the signal 403C may be unaffected by the offset generator 410C.

The comparator 408C may receive the signal 403C' at input terminals I1 and I2. As noted above, the signal 403C' may be an amplified (or otherwise processed) version of the signal 403C. In this regard, the comparator 408C may receive one of the components of the signal 403C (or an amplified/processed version thereof) at input terminal I1 and the other one of the components of the signal 403C (or an amplified/processed version thereof) at input terminal I2.

In operation, the comparator 408C may evaluate the function max (I1, I2) and output a signal 409C as a result of executing the function. When the input at terminal I1 is greater than the input at terminal I2, the comparator 408C may set signal 409C to '1' (i.e., 'logic-high'). When the input at terminal I1 is smaller than the input at terminal I2, the comparator 408C may set the signal 409C to '0' (i.e., logic-low). So, when the signal 403C has a normal polarity, if the first component of signal 403C is greater than the second component of signal 403C, the signal 409C may be set to '1', and otherwise, if the first component is smaller than the second component, the signal 409C may be set to '0'. On the other hand, when the signal 403C has a reversed polarity, if the first component of signal 403C is greater than the second component of signal 403C, the signal 409C may be set to '0', and otherwise, if the first component is smaller than the second component, the signal 409C may be set to '1'.

Figure 5:
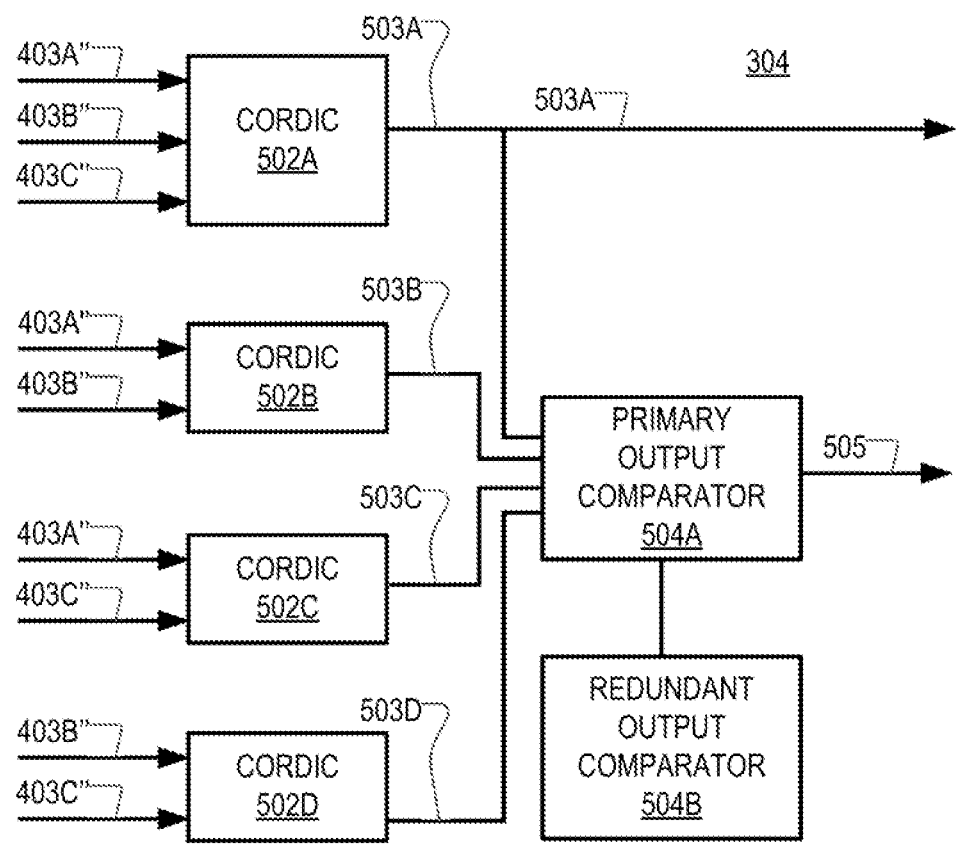
FIG. 5 is a diagram of a second stage of the sensor of claim 3, according to aspects of the disclosure.

FIG. 5 is a diagram of the second stage 304 of the sensor 110 in accordance with one particular implementation. As illustrated, the second stage 304 may include CORDIC processors 502A-D, a primary output comparator 504A, and a redundant output comparator 504B. The processor 502A may receive signals 403A", 403B," and 403C" and generate an output signal 503A based on one or more of signals 403A", 403B", and 403C". According to the example of FIG. 5, the output signal 503A indicates the angular position of the target 120. However alternative implementations are possible in which the signal identifies another characteristic of the movement of the target 120, in addition to (or instead of) angular position, such as speed, direction of rotation, acceleration, etc. In some implementations, the output signal 503A may be output by the sensor 110 to an external device. Additionally or alternatively, in some implementations, the output signal 503A may be output from the second stage 304 of the sensor 110 to another component of the sensor 110.

The processor 502B may receive signals 403A" and 403B" and generate an output signal 503B based on signals 403A" and 403B". According to the example of FIG. 5, the output signal 503B indicates the angular position of the target 120. However alternative implementations are possible in which the signal identifies another characteristic of the movement of the target 120, in addition to (or instead of) angular position, such as speed, direction of rotation, acceleration, etc.

The processor 502C may receive signals 403A" and 403C" and generate an output signal 503C based on signals 403A" and 403C". According to the example of FIG. 5, the output signal 503C indicates the angular position of the target 120. However alternative implementations are possible in which the signal identifies another characteristic of the movement of the target 120, in addition to (or instead of) angular position, such as speed, direction of rotation, acceleration, etc.

The processor 502D may receive signals 403B" and 403C" and generate an output signal 503D based on signals 403B" and 403C". According to the example of FIG. 5, the signal 503D indicates the angular position of the target 120. However alternative implementations are possible in which the signal identifies another characteristic of the movement of the target 120, in addition to (or instead of) angular position, such as speed, direction of rotation, acceleration, etc.

The primary output comparator 504A may include any suitable type of electronic circuitry that is arranged to compare signals 503A-D to determine if they are in agreement. The redundant output comparator 504B may include any suitable type of electronic circuitry that is arranged to compare signals 503A-D to determine if they are in agreement. The redundant output comparator 504B may duplicate the functions of the primary output comparator 504A to increase the fault tolerance of the sensor 110. The primary output comparator 504A may output an error signal 505. When the signals 503A-D are in agreement with each other, and both of the primary output comparator 504A and the redundant output comparator 504B agree that signals 503A-D are in agreement, the primary output comparator 504A may set the error signal 505 to a first value (e.g., '0') indicating that no errors are present. When signals 503A-D are not in agreement, or when the primary output comparator 504A is not in agreement with the redundant output comparator 504B, the primary output comparator 504A may set the error signal 505 to a second value (e.g., '1') indicating the presence of an error.

Figure 6:
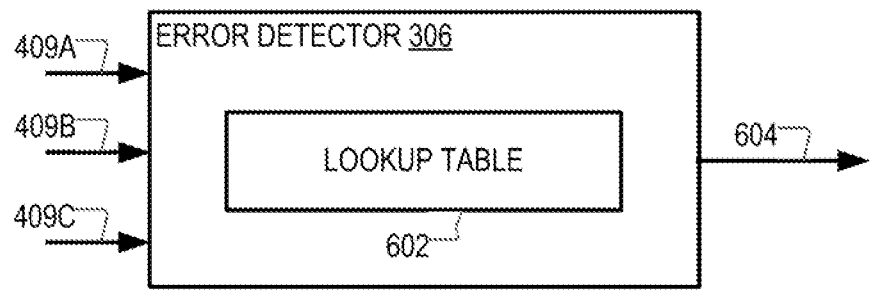
FIG. 6 is a diagram of an error detector of the sensor of claim 3, according to aspects of the disclosure.

FIG. 6 is a diagram of the error detector 306, according to aspects of the disclosure. The error detector 306 may receive signals 409A-C as input and generate an error signal 604. When the error signal 604 is set to a first value (e.g., '0'), this may indicate that no errors are present. On the other hand, when the error signal 604 is set to a second value (e.g., '1'), this may indicate the presence of an error. As is discussed further below, the error detector 306 may compare the values of signals 409A, 409B, and 409C when each of signals 403A, 403B, and 403C has a normal polarity to the values of signals 409A, 409B, and 409C, respectively, when each of signals 403A, 403B, and 403C has a reversed polarity, and generate the error signal 604 based on the outcome of the comparison. In some implementations, the comparison may be performed by using a lookup table 602, which is stored in a memory of the sensor 110, and which is discussed further below with respect to FIG. 11.

Figure 7:
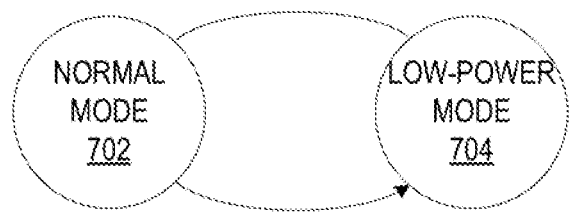
FIG. 7 is state diagram illustrating aspects of the operation of the sensor of FIG. 3, according to aspects of the disclosure.

FIG. 7 is a state diagram illustrating aspects of the operation of the sensor 110, according to aspects of the disclosure. Specifically, FIG. 7 illustrates that when the sensor 110 is running, the sensor 110 may be in one of a normal mode 702 or a low-power mode 704. When the sensor is in the normal mode 702, signal 503A is output from the second stage 304 of the sensor 110 to an external device (e.g., an electronic control unit (ECU), etc.). When the sensor 110 is in the low-power mode 704, the second stage 304 of the sensor 110 is disabled (e.g., turned off), and signals 409A-C are processed in the digital domain. Under the nomenclature of the present disclosure, the collection of values of the signals 409A-C at a given time instance is referred to a "word." The transitions between the normal mode 702 and the low-power mode may be driven by a signal that is received at one or more input terminals of the sensor 110 or by digital logic that is built into the sensor 110.

Figure 8:
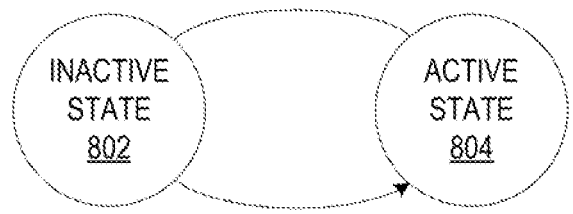
FIG. 8 is state diagram illustrating aspects of the operation of the sensor of FIG. 3, according to aspects of the disclosure.

FIG. 8 is a state diagram illustrating aspects of the operation of the sensor 110, when the sensor 110 is in the low-power mode 704. Specifically, FIG. 8 illustrates that when the sensor 110 is in the low-power mode, the sensor 110 may be either in an inactive state 802 or in an active state 804. When the sensor 110 is the inactive state 802, the first stage 302 (or most of it) may be disabled (e.g., powered off). When the sensor 110 is the active state, the first stage 302 may be enabled and used to sample the signals 403A-C to generate the signals 409A-C.

Figure 9:
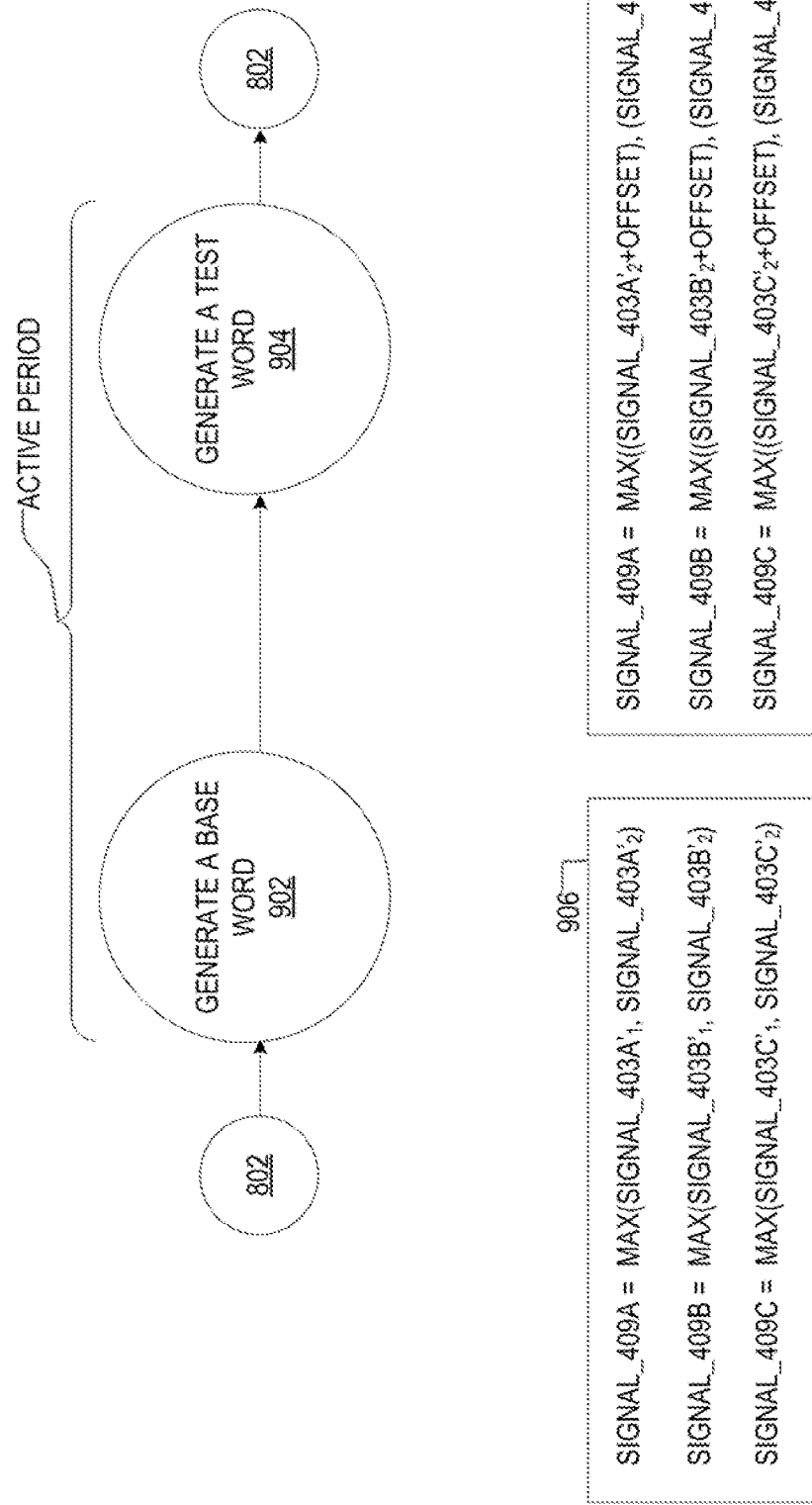
FIG. 9 is state diagram illustrating aspects of the operation of the sensor of FIG. 3, according to aspects of the disclosure.

FIG. 9 is a state diagram illustrating aspects of the operation of the sensor 110, when the sensor 110 is in the active state 804. Specifically, FIG. 8 illustrates that when the sensor 110 is in the active state 804, the sensor 110 may be in one of a state 902 and a state 904.

When the sensor 110 is in state 902, the sensor 110 generates a base word. More particularly, when the sensor 110 is in the state 902: (i) sensing module 202A sets the signal 403A to a normal polarity, (ii) sensing module 202B sets the signal 403B to a normal polarity, (iii) sensing module 202C sets the signal 403C to a normal polarity, (iv) the offset generator 410A causes the offset signal 411A to equal the value of the offset that is stored in the register 425A, such that the offset on the signal 403A is equal to zero, (v) the offset generator 410B off offset signal 411B to equal the value of the offset that is stored in the register 425B, such that the offset on the signal 403B is equal to zero, (vi) the offset generator 410C causes the offset signal 411C to equal the value of the offset that is stored in the register 425C, such that the offset on the signal 403C is equal to zero, (vii) the comparator 408A generates the signal 409A by evaluating the function max(signal_$403A_1$,signal_$403A_2$), where signal_$403A_1$ is the first component of the signal 409A and signal $409A_2$ is the second component of the signal $409A_1$ (viii) the comparator 408B generates the signal 409B by evaluating the function max(signal_$403B_1$,signal_$403B_2$), where signal_$403B_1$ is the first component of the signal 409B and signal $409B_2$ is the second component of the signal 409B, and (ix) the comparator 408C generates the signal 409C by evaluating the function max(signal_$403C_1$, signal_$403C_2$), where signal_$403C_1$ is the first component of the signal 409C and signal $409C_2$ is the second component of the signal 409C. Under the nomenclature of the present disclosure, the collection of values of the signals 409A-C, which are generated while the sensor 110 is in the state 902, is referred to as a base word. Block 906 shows the values of each of signals 409A-C when the sensor 110 is in state 902.

When the sensor 110 is in the state 904, the sensor 110 generates a test word. More particularly, when the sensor 110 is in the state 904: (i) sensing module 202A sets the signal 403A to a reversed polarity, (ii) sensing module 202B sets the signal 403B to a reversed polarity, (iii) sensing module 202C sets the signal 403C to a reversed polarity, (iv) the offset generator 410A causes the offset signal 411A to equal the sum of the base offset value that is stored in register 425A (e.g., zero, etc.) and the value of the offset that is stored in offset register 424A, (v) the offset generator 410B causes the offset signal 411B to equal the sum of the base offset value that is stored in register 425B (e.g., zero, etc.) and the value of the offset that is stored in offset register 424B, (vi) the offset generator 410C causes the offset signal 411C to equal the sum of the base offset value that is stored in register 425C (e.g., zero, etc.) and the value of the offset that is stored in offset register 424C, (vii) the comparator 408A generates the signal 409A by evaluating the function max(signal_$403A_2$,signal_$403A_1$), where signal_$403A_1$ is the first component of the signal 409A and signal $409A_2$ is the second component of the signal 409A, (vii) the comparator 408B generates the signal 409B by evaluating the function max(signal_$403B_2$,signal_$403B_1$), where signal_$403B_1$ is the first component of the signal 409B and signal $409B_2$ is the second component of the signal 409B, and (ix) the comparator 408C generates the signal 409C by evaluating the function max(signal_$403C_2$,signal_$403C_1$), where signal_$403C_1$ is the first component of the signal 409C and signal $409C_2$ is the second component of the signal 409C. Under the nomenclature of the present disclosure, the collection of values of the signals 409A-C, which are generated while the sensor 110 is in the state 904, is referred to as a test word. Block 908 shows the values of each of signals 409A-C when the sensor 110 is in state 904.

When the sensor 110 is in the state 902, the error detector 306 may generate a base word by sampling (or otherwise detecting) the values of signals 409A-C. Under the nomenclature of the present disclosure, the collection of values of the signals 409A-C, which are generated while the sensor 110 is in the state 902, is referred to as a base word. When the sensor 110 is in the state 904, the error detector 306 may generate a test word by sampling (or otherwise detecting) the values of signals 409A-C. Under the nomenclature of the present disclosure, the collection of values of the signals 409A-C, which are generated while the sensor 110 is in the state 904, is referred to as a test word.

As indicated by FIGS. 8-9, when the sensor is in the low-power mode 704, the sensor may wake up, generate a base word, generate a test word, and go back to sleep. Both the test word and the base word may be generated over the duration of the same active period. The term "active period" as used herein refers to duration that starts when sensor 110 exits the inactive state 802 and ends when the sensor 110 returns back into the inactive state 802. In other words, the term "active period" may also be refer to a single continuous period in which the sensor 110 is in the active state 804.

As noted above, during a given active period, the error detector 306 may generate both a base word and a test word.

The base word may be generated when the signals 403A-C have a normal polarity and no offset that is imparted by the offset generators 410A-C. The test word may be generated when the polarity of the signals 403A-C is reversed and each of the signals 403A-C is offset by a respective one of the offset generators 410A-C.

FIG. 10 shows the structure of a base word and a test word in further detail. FIG. 10 illustrates that the base word may include three bits, wherein: the first bit is equal to (or otherwise based on) the value of signal 409A when the sensor 110 is in state 902, the second bit is equal (or otherwise based on) the value of signal 409B when the sensor is in state 902, and the third bit is equal to (or otherwise based on) the value of signal 409C when the sensor 110 is in state 902. FIG. 10 further illustrates that the test word may include three bits, wherein: the first bit is equal to (or otherwise based on) the value of signal 409A when the sensor 110 is in state 904, the second bit is equal (or otherwise based on) the value of signal 409B when the sensor 110 is in state 904, and the third bit is equal to (or otherwise based on) the value of signal 409C when the sensor 110 is in state 904.

Figures 11, 12:
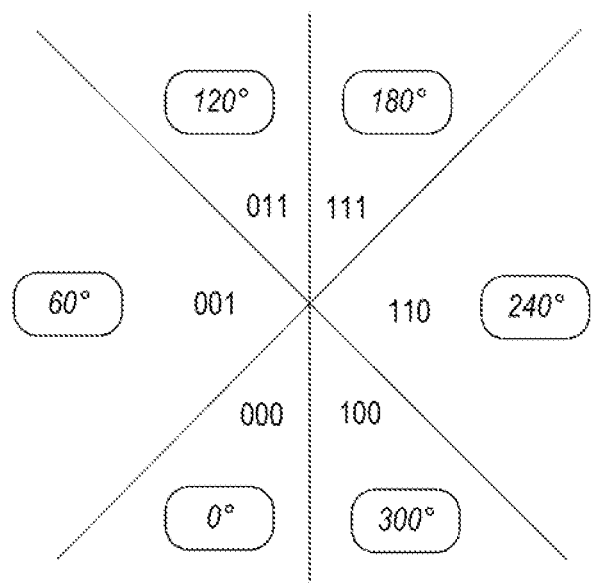
FIG. 11 is a diagram of a lookup table, according to aspects of the disclosure.
FIG. 12 is a plot illustrating the relationship between different base words and the angular position of a target, according to aspects of the disclosure.

In operation, the error detector 306 may compare a base word that is detected during a given active period with a test word that is generated during the same active period. If the base word matches the test word, error detector 306 may determine that the sensor 110 is operating correctly and set the error signal 604 (shown in FIG. 6) to a first value (e.g. '0'). If the base word does not match the test word, error detector 306 may determine that the sensor 110 has failed and set the error signal 604 (shown in FIG. 6) to a second value (e.g. '1'). In some implementations, the test word may be matched to the base word by using the table 602. As illustrated in FIG. 11, table 602 may include a plurality of entries 1102. Each entry 1102 may identify a base word and one or more test words that match the base word. In the example of FIG. 11, entry 1102A indicates that test word '111' matches base word '000'; entry 1102B indicates that test word '110' matches base word '001'; entry 1102C indicates that test word '100' matches base word '011'; entry 1102D indicates that test word '011' matches base word '100'; entry 1102E indicates that test word '001' matches base word '110'; and entry 1102F indicates that test word '000' matches base word '111'.

Although in the example of FIG. 11, each of the entries 1102 identifies only one respective test word that matched each of the base words, alternative implementations are possible in which any of the base words may be matched with multiple test words by the base word's respective entry 1102. However, according to the present disclosure, it has been determined that in order for the sensor 110 to be able to detect errors 98% of the time (i.e. in order for the sensor 110 to achieve 98% ASIL coverage), each entry must identify only one test word, which is also the exact inverse of the entry's base word. The determination has been made by simulating stuck-at conditions for the three channels, considering angular target positions covering the six base words. As a result of the simulation, it has been determined that when each of the entries 1102 is expanded to identify two additional acceptable test words (i.e., adjacent ones) the stuck-at is not guaranteed to be detected at all magnet positions. Nevertheless, in applications in which lower levels of fault tolerance are required, each of the entries 1102 may identify multiple test words that match the entry's base word.

FIG. 12 illustrates the relationship between the angular position of the target 120 and different ones of the base words that are shown in FIG. 11. Specifically, FIG. 12 illustrates that: when target 120 has an angular position of 0 degrees and the sensor 110 is in state 902, the sensor 110 may generate base word '000'; when target 120 has an angular position of 60 degrees and the sensor 110 is in state 902, the sensor 110 may generate base word '001'; when target 120 has an angular position of 120 degrees and the sensor 110 is in state 902, the sensor 110 may generate base word '011'; when target 120 has an angular position of 180 degrees and the sensor 110 is in state 902, the sensor 110 may generate base word '111'; when target 120 has an angular position of 240 degrees and the sensor 110 is in state 902, the sensor 110 may generate base word '110'; and when target 120 has an angular position of 300 degrees and the sensor 110 is in state 902, the sensor 110 may generate base word '100'.

As noted above, in each active period, the sensor 110 may generate both a base word and a test word. If the sensor is operating correctly, the test word would be the inverse of the base word. If the sensor 110 has failed (e.g., if there is a stuck bit in one of signal paths 301A-C, etc.), the test word would not be the inverse of the test word. In other words, under the approach outlined so far, the sensor 110 detects errors by determining whether a test word is the inverse of the base word that is generated during the same active period as the test word.

One challenge to using this approach is that, under some circumstances, the sensor 110 may be operating correctly, and a test word that is generated in the same active period as a base word, may not be an exact inverse of the base word. For example, if the first and second components of signal 409A (or one of signals 409B-C) are close to one another, evaluating $\max(\text{signal\_409A}_1, 409A_2)$ may yield the same result as evaluating $\max(\text{signal\_409A}_2, 409A_1)$ due to noise or a stray magnetic field that is present in the environment of the sensor 110. To prevent the error detector 306 from generating false positives two approaches are possible. The first approach involves expanding each of the entries 1102 to identify additional acceptable test words. The second approach involves utilizing offset generators 410A-C to offset the values of signals 409A-C by an offset that is greater than any expected noise and/or stray magnetic fields. In some respects, offsetting the signals 403A-C may impart a sufficient distance between the respective components of each of signals 403A-C and ensure that the outcome of the comparison of the respective components would not be affected by noise or stray magnetic fields (provided that the offset is large enough to eclipse the effects of noise and stray magnetic fields).

In some applications, it may be desirable for the sensor 110 to achieve compliance with one of the standards of Automotive Safety Integrity Level (ASIL). To achieve such compliance, the sensor 110 may need to ensure that errors are detected correctly by the error detector 306 ninety-eight percent (98%) of the time. According to the present disclosure, it has been determined that the first approach, which is discussed above, may not be sufficient to achieve such compliance, while the second approach is sufficient. As noted above, the determination has been made by simulating stuck-at conditions for the three channels, considering angular target positions covering the six base words. As a result of the simulation, it has been determined that when each of the entries 1102 is expanded to identify two additional acceptable test words (i.e., adjacent ones) the stuck-at is not guaranteed to be detected at all magnet positions.

Figure 13:
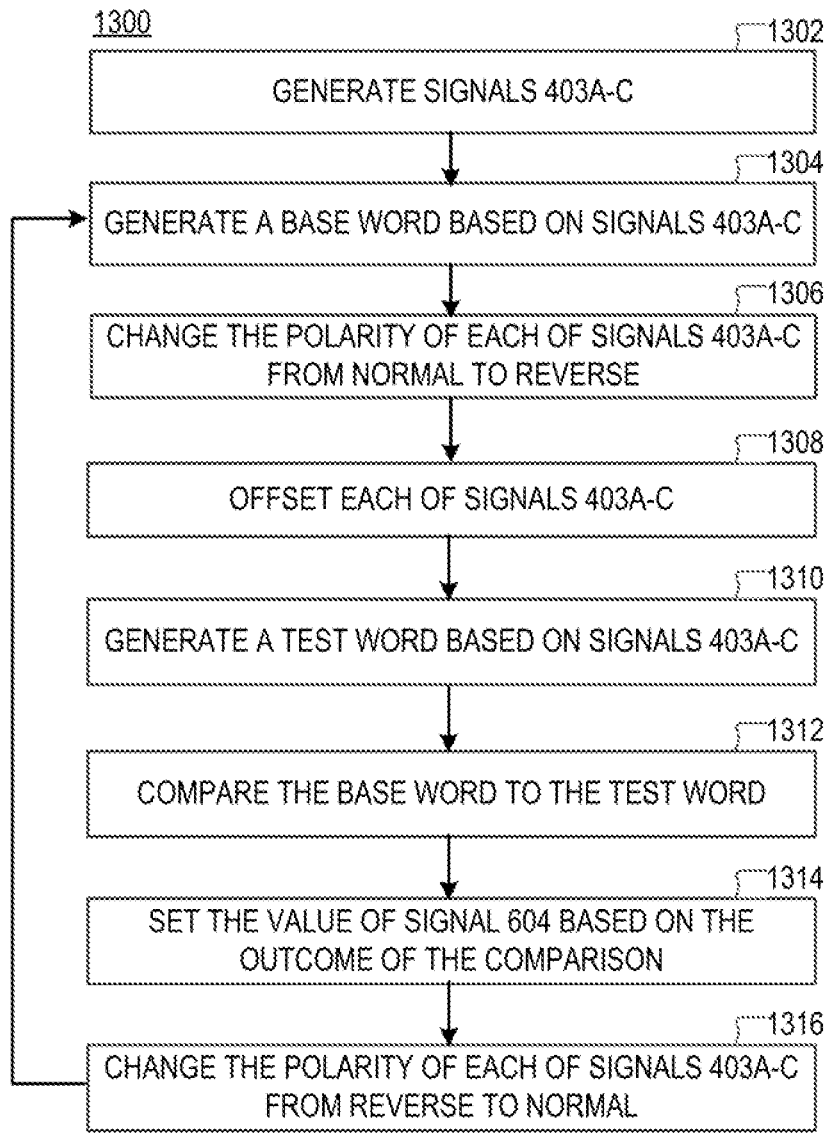
FIG. 13 is a flowchart of an example of a process, according to aspects of the disclosure.

FIG. 13 is a flowchart of an example of a process, according to aspects of the disclosure. At step 1302, the sensing modules 202A-C begin generating signals 403A-C. At step 1304, a base word is generated based on signals 403A-C. The base word may be the same or similar to the base word that is shown in FIG. 10. The base word is generated when each of the signals 403A-C has a normal polarity. At step 1306, the polarity of each of signals 403A-C is changed. More particularly, the polarity of each of signals 403A-C is changed from "normal polarity" to "reversed polarity". At step 1308, each of the signals 403A-C is offset by a respective one of the offset generators 410A-C. At step 1310, a test word is generated based on signals 403A-C. The test word may be the same or similar to the test word that is shown in FIG. 10. At step 1312, the test word is compared to the base word. At step 1314, the value of the error signal 604 is set based on the outcome of the comparison. If the base word matches the test word, the error signal 604 is set to a first value indicating that the sensor 110 is operating correctly. Otherwise, if the base word does not match the test word, the error signal 604 is set to a second value indicating that the sensor 110 has failed. At step 1316, the polarity of each of signals 403A-C is changed. More particularly, the polarity of each of signals 403A-C is changed from "reversed polarity" to "normal polarity".

In some implementations, the base word (generated at step 1304) is said to match the test word (generated at step 1310) only when the test word is the inverse of the base word. However, in alternative implementations, the base word may match the test word when the test word belongs to a set of one or more test words that is associated with the base word. According to the present example, the comparison of the base word with the test word is performed by using comparison table, such as the table 602 (shown in FIG. 11). Performing the comparison involves: (i) identifying an entry in the table that contains the base word, and (ii) detecting whether the entry contains the test word as well. If the entry contains the test word, the test word is said to match the base word. On the other hand, if the entry does not contain the test word, the test word is said to not match the base word. However, it will be understood that the present disclosure is not limited to using a lookup table for comparing the base word to the test word. For example, in some implementations, digital logic (including a series of logic gates) may be used to perform the comparison.

In the example of FIGS. 1A-13, each of the sensing modules 202A-C includes at least two magnetic field sensing elements. However, it will be understood that alternative implementations are possible in which each (or at least one) of the sensing modules 202A-C includes only one magnetic field sensing element. Although in the example of FIGS. 1A-13, the sensor 110 includes three channels, alternative implementations are possible in which the sensor 110 includes only one channel. In such implementations, the base word (generated at step 1304) and the test word (generated at step 1310) may be 1-bit wide, and it may be equal to the signal 409A, which is output by the comparator 408A. Although in the example of FIGS. 1A-13 comparators 408A-C are used to generate the base word, it will be understood that the present disclosure is not limited to any specific techniques for comparing the components of the signals 403A-C. As used throughout the disclosure, the term processing circuitry may refer to any suitable type of electronic circuitry that is configured to perform an action. For example, a processing circuitry may include a general-purpose processor, a special-purpose processor, digital logic, one or more amplifiers, one or more comparators, and or any other suitable type of processing circuitry. Although in the example of FIGS. 1A-13, the polarities of signals 403A-C are reversed by the sensing modules 202A-C, it will be understood that in some implementations, the polarities of the signals 403A-C may be reversed by other switching circuitry that is available in the sensor 110. For example, in some implementations, the polarities of each of the signals 403A-C may be placing a cross-over switch at the inputs at each of comparators 408A-C.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., a addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type. III-V. semiconductor material like Gallium-Arsenide (GaAs) or an Indium compound, e.g., Indium-Antimonide (InSb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A method for use in a sensor, comprising:
generating a first signal, the first signal being generated by a first sensing module in response to a magnetic field associated with a rotating target;
generating a base word based on the first signal, the base word including a first base bit that is generated by comparing respective components of the first signal;
reversing a respective polarity of the first signal and offsetting the first signal;
generating a test word based on the first signal, the test word being generated after the respective polarity of the first signal is reversed and the first signal is offset, the test word including a first test bit that is generated by comparing the respective components of the first signal; and
setting a value of an error signal based on whether the test word matches the base word.

2. The method of claim 1, wherein the first sensing module includes at least two magnetic field sensing elements that are spaced apart from one another, each of the magnetic field sensing elements including at least one of a Hall element, a giant magnetoresistor (GMR), or a tunnel magnetoresistor (TMR).

3. The method of claim 1, further comprising:
generating a second signal, the second signal being generated by a second sensing module in response to the magnetic field; and
reversing a respective polarity of the second signal and offsetting the second signal,
wherein the base word further includes a second base bit that is generated by comparing respective components of the second signal,
the test word is generated after the second signal is offset and the respective polarity of the second signal reversed, and
the test word further includes a second test bit that is generated by comparing the respective components of the second signal.

4. The method of claim 1, wherein:
the test word matches the base word only when the test word is an inverse of the base word, and
setting the value of the error signal includes setting the error signal to a first value when the test word is the inverse of the base word and setting the error signal to a second value when the test word is not the inverse of the base word.

5. The method of claim 1, wherein the respective polarity of the first signal is reversed by the first sensing module.

6. The method of claim 1, wherein the first signal is offset by adjusting a gain of a first amplifier that is configured to amplify the first signal.

7. The method of claim 1, wherein the first sensing module includes at least one magnetic field sensing element.

8. The method of claim 1, further comprising generating an indication of at least one of speed of the rotating target, direction of rotation of the rotating target, angular position of the rotating target, and acceleration of the rotating target, the indication being generated based on the base word.

9. The method of claim 1, further comprising:
generating a second signal and a third signal, the second signal being generated by a second sensing module in response to the magnetic field, and the third signal being generated by a third sensing module in response to the magnetic field; and
reversing respective polarities of the second signal and the third signal, and offsetting each of the second signal and the third signal,
wherein the base word further includes a second base bit that is generated by comparing respective components of the second signal and a third base bit that is generated by comparing respective components of the third signal,
wherein the test word further includes a second test bit that is generated by comparing the respective components of the second signal and a third test bit that is generated by comparing the respective components of the third signal,
wherein the base word is generated before the respective polarities of the second signal and the third signal are reversed, and the test word is generated after the second signal and the third signal are offset and the respective polarities of the second signal and the third signal are reversed.

10. The method of claim 1, wherein the base word and the test word are generated when the sensor is in a low-power mode, and the base word and the test word are generated during a same active period of the low-power mode.

11. A sensor, comprising:
a first sensing module that is configured to generate a first signal in response to a magnetic field associated with a rotating target, the first sensing module being configured to alternate a first polarity of the first signal between a normal polarity and a reversed polarity;
an offsetting circuitry configured to offset the first signal when the first polarity of the first signal is reversed; and
processing circuitry configured to:
generate a base word based on the first signal, the base word including a first base bit that is generated by comparing respective components of the first signal, the base word being generated when the first signal has a normal polarity;
generate a test word based on the first signal, the test word being generated after the first polarity of the first signal is reversed and the first signal is offset, the test word including a first test bit that is generated by comparing the respective components of the first signal; and
set a value of an error signal based on whether the test word matches the base word.

12. The sensor of claim 11, wherein the first sensing module includes at least two magnetic field sensing elements that are spaced apart from one another, each of the magnetic field sensing elements including at least one of a Hall element, a giant magnetoresistor (GMR), or a tunnel magnetoresistor (TMR).

13. The sensor of claim 11, further comprising:
a second sensing module that is configured to generate a second signal in response to the magnetic field, the second sensing module being configured to alternate a second polarity of the second signal between a normal polarity and a reversed polarity, wherein the offsetting circuitry is further configured to offset the second signal when the second polarity of the second signal is reversed, wherein the base word is further generated based on the second signal, such that the base word includes a second base bit that is generated by comparing respective components of the second signal, the base word being generated when the second signal has a normal polarity, and wherein the test word is further generated based on the second signal, such that the test word includes a second test bit that is generated by comparing the respective components of the second signal, the test word being generated when the second polarity of the second signal is reversed.

14. The sensor of claim 11, wherein:
the test word matches the base word only when the test word is an inverse of the base word, and
setting the value of the error signal includes setting the error signal to a first value when the test word is the inverse of the base word and setting the error signal to a second value when the test word is not the inverse of the base word.

15. The sensor of claim 11, further comprising:
a second sensing module that is configured to generate a second signal in response to the magnetic field, the second sensing module being configured to alternate a second polarity of the second signal between a normal polarity and a reversed polarity;
a third sensing module that is configured to generate a third signal in response to the magnetic field, the third sensing module being configured to alternate a third polarity of the third signal between a normal polarity and a reversed polarity,
wherein the offsetting circuitry is further configured to offset the second signal when the second polarity of the second signal reversed, and offset the third signal when the third polarity of the third signal is reversed,
wherein the base word is further generated based on the second signal and the third signal, such that the base word includes a second base bit that is generated by comparing respective components of the second signal and a third base bit that is generated by comparing respective components of the third signal,
wherein the test word is further generated based on the second signal and the third signal, such that the test word includes a second test bit that is generated by comparing the respective components of the second signal and a third test bit that is generated by comparing the respective components of the third signal,
wherein the base word is generated when each of the second signal and the third signal has a normal polarity, and
wherein the test word is generated when each of the second polarity of the second signal is reversed and the third polarity of the third signal is reversed.

16. The sensor of claim 11, wherein the first signal is offset by adjusting a gain of a first amplifier that is configured to amplify the first signal.

17. The sensor of claim 11, wherein the first sensing module includes at least one magnetic field sensing element.

18. The sensor of claim 11, wherein the processing circuitry is further configured to generate, based on the base word, an indication of at least one of speed of the rotating target, direction of rotation of the rotating target, angular position of the rotating target, and acceleration of the rotating target.

19. The sensor of claim 11, further configured to output the base word to an external device.

20. The sensor of claim 11, wherein the base word and the test word are generated when the sensor is in a low-power mode, and the base word and the test word are generated during a same active period of the low-power mode.

21. The sensor of claim 11, wherein the processing circuitry includes a first comparator that is arranged to generate the first base bit and the first test bit by comparing the respective components of the first signal.

22. A sensor, comprising:
means for generating a first signal in response to a magnetic field associated with a rotating target;
means for generating a base word based on the first signal, the base word including a first base bit that is generated by comparing respective components of the first signal;
means for reversing a respective polarity of the first signal and offsetting the first signal;
means for generating a test word based on the first signal, the test word being generated after the respective polarity of the first signal is reversed and the first signal is offset, the test word including a first test bit that is generated by comparing the respective components of the first signal; and
means for setting a value of an error signal based on whether the test word matches the base word.

23. The sensor of claim 22, further comprising:
means for generating a second signal in response to the magnetic field; and
means for reversing a respective plurality of the second signal and offsetting the second signal,
wherein the base word further includes a second base bit that is generated by comparing respective components of the second signal,
wherein the test word is generated after the second signal is offset and the respective polarity of the second signal is reversed, and
wherein the test word further includes a second test bit that is generated by comparing the respective components of the second signal.

24. The sensor of claim 22, wherein:
the test word matches the base word only when the test word is an inverse of the base word, and
setting the value of the error signal includes setting the error signal to a first value when the test word is the inverse of the base word and setting the error signal to a second value when the test word is not the inverse of the base word.

25. The sensor of claim 22, wherein the base word and the test word are generated when the sensor is in a low-power mode, and the base word and the test word are generated during a same active period of the low-power mode.

* * * * *